US008158048B2

(12) United States Patent
Ohashi et al.

(10) Patent No.: US 8,158,048 B2
(45) Date of Patent: Apr. 17, 2012

(54) MOLD FOR FINE PATTERN TRANSFER AND METHOD FOR FORMING RESIN PATTERN USING SAME

(75) Inventors: Kenya Ohashi, Hitachinaka (JP); Masahiko Ogino, Hitachi (JP); Akihiro Miyauchi, Hitachi (JP)

(73) Assignee: Hitachi Industrial Equipment Systems Co., Ltd., Tokyo (JP)

( * ) Notice: Subject to any disclaimer, the term of this patent is extended or adjusted under 35 U.S.C. 154(b) by 174 days.

(21) Appl. No.: 11/847,636

(22) Filed: Aug. 30, 2007

(65) Prior Publication Data

US 2008/0237931 A1 Oct. 2, 2008

(30) Foreign Application Priority Data

Mar. 30, 2007 (JP) ................................. 2007-092910

(51) Int. Cl.
*B29C 59/00* (2006.01)
(52) U.S. Cl. ........ 264/293; 264/107; 264/319; 425/385; 425/388; 425/405.1; 977/887
(58) Field of Classification Search .................. 977/887; 264/107, 293, 319; 425/385, 388, 405.1
See application file for complete search history.

(56) References Cited

U.S. PATENT DOCUMENTS

| | | | | |
|---|---|---|---|---|
| 1,546,573 A | * | 7/1925 | Edison | 264/107 |
| 3,733,159 A | * | 5/1973 | Coffman | 425/186 |
| 5,259,926 A | | 11/1993 | Kuwabara et al. | |
| 5,362,763 A | * | 11/1994 | Al Ghatta et al. | 521/79 |
| 5,772,905 A | | 6/1998 | Chou | |
| 5,817,242 A | * | 10/1998 | Biebuyck et al. | 216/41 |
| 2002/0020484 A1 | * | 2/2002 | Feist et al. | 156/196 |
| 2002/0042027 A1 | * | 4/2002 | Chou et al. | 430/322 |
| 2002/0177319 A1 | * | 11/2002 | Chou | 438/690 |
| 2003/0051797 A1 | * | 3/2003 | Lines et al. | 156/209 |
| 2003/0057601 A1 | * | 3/2003 | Reitz et al. | 264/239 |
| 2004/0131718 A1 | * | 7/2004 | Chou et al. | 425/385 |
| 2004/0200368 A1 | * | 10/2004 | Ogino et al. | 101/34 |
| 2008/0122144 A1 | * | 5/2008 | Zhang et al. | 264/571 |
| 2010/0021577 A1 | * | 1/2010 | Stewart et al. | 425/3 |

FOREIGN PATENT DOCUMENTS

JP 2002-100079 4/2002

OTHER PUBLICATIONS

Office Action issued in Japanese Patent Application No. 2007-092910 on Nov. 22, 2011, Partial Translation.

* cited by examiner

*Primary Examiner* — Christina Johnson
*Assistant Examiner* — Saeed Huda
(74) *Attorney, Agent, or Firm* — Antonelli, Terry, Stout & Kraus, LLP.

(57) ABSTRACT

A mold for forming a resin pattern using nanoimprint lithography according to the present invention comprises a main mold including a fine pattern of a protrusion and a depression intended to be transferred, and a spacer for forming a space between the protrusion of the fine pattern of the main mold and a transferred object during a transfer of the fine pattern, in which the spacer has a vent passage capable of flowing gas therethrough and has an elasticity against a pressing force during the transfer.

11 Claims, 7 Drawing Sheets

(a)

(b)

(a)

(b)

MOLD FOR FINE PATTERN TRANSFER AND METHOD FOR FORMING RESIN PATTERN USING SAME

CLAIM OF PRIORITY

The present application claims priority from Japanese application serial no. 2007-092910 filed on Mar. 30, 2007, the content of which is hereby incorporated by reference into this application.

BACKGROUND OF THE INVENTION

1. Field of the Invention

The present invention relates to molds for pattern transfer and methods for forming a resin pattern using them. It particularly relates to molds for fine pattern transfer and methods for forming a resin pattern using them in order to achieve fine pattern transfer with high accuracy at low cost by nanoimprint lithography.

2. Description of Related Art

In conventional processes for manufacturing semiconductor devices, etc., photolithographies are commonly used to form patterns of fine features. However, as the pattern size has continually decreased, they have presented a drawback of increased equipment and manufacturing cost, because, e.g., the pattern size has been limited by the wavelength of light used in the exposure, or an increasingly higher alignment accuracy has been required.

To address such problem, a technology of forming a fine pattern at low cost is disclosed in U.S. Pat. Nos. 5,259,926 and 5,772,905, etc. According to this technology, a desired fine pattern is transferred by pressing a stamper (forming member or mold) having the negative of a fine pattern of protrusions and depressions intended to be transferred against a resist film layer formed on a receiver substrate (transferred object). Particularly, it is described in the above-mentioned U.S. Pat. No. 5,772,905 that the nanoimprint technology can form a pattern of fine dimensions below 25 nanometers in one transfer.

FIG. 1 is a schematic illustration showing an example of a process flow chart for forming a fine pattern using a conventional nanoimprint technique. In this example, as shown in FIG. 1(a), a mold 101, and a transferred object 200 with a resin 202 for patterning applied on the surface of a receiver substrate (transferred object) 201, are each fixed on one of a pair of stages (not shown), the distance between which is controllable.

Then, the stages are actuated to press the mold 101 against the resin 202 so that the portion of the resin 202 facing a protrusion of the mold 101 is removed to expose the corresponding surface of the transferred object 201, thereby forming a resin pattern as shown in FIG. 1(b). When the film thickness of the resin 202 is larger than the height of the protrusion of the mold 101, a residual remains in a depression of the resin 202 as shown in FIG. 1(c). In such a case, the residual is etched by reactive ion etching or the like to expose the surface of the transferred object 201 at the depression of the pattern. In this manner, a resin pattern as shown in FIG. 1(b) can be obtained.

For example, the resin pattern thus obtained can be used as a mask to etch the exposed surface of the transferred object 201 as shown in FIG. 1(d) and then the resin 202 is removed, thereby forming a groove structure as shown in FIG. 1(e). For another example, as shown in FIG. 1(f), a metal film 203 or the like can be formed over the entire surface of the transferred object 200 and then the resin 202 is etched to form a structure having a predetermined pattern as shown in FIG. 1(g).

However, there still remain the following problems in nanoimprint technologies which are deemed to be capable of forming a fine pattern with high accuracy. For example, in FIG. 1(a), the transferred object 200 and mold 101 are each fixed on a stage; therefore, a high accuracy alignment between distant points is required, causing a possible productivity degradation or equipment cost increase.

On the other hand, there is a method in which the mold 101 is placed directly on the transferred object 200 (of course, vice versa is possible) rather than fixing them on stages. Typically, the resin 202 serving as a transferred object is heated up to about its glass transition temperature before a pattern transfer in order to secure flowability during the pattern transfer. This heating may release gaseous components remaining in the resin or degradation products from the resin as gas. The above-mentioned direct placement case presents a problem in that this gas remains between the depression of the mold 101 pattern and resin 202, degrading fine pattern transfer accuracy.

SUMMARY OF THE INVENTION

Under these circumstances, it is an object of the present invention to solve the above-mentioned problem and to provide a mold for transferring a fine pattern. It is further object of the present invention to provide a method for forming a resin pattern using the mold which can realize fine pattern transfer using nanoimprint lithography with high accuracy and at low cost compared to conventional methods.

(1) According to one aspect of the present invention, a mold for nanoimprint lithography comprises a main mold including a fine pattern of a protrusion and a depression intended to be transferred, and a spacer for forming a space between the protrusion of the fine pattern of the main mold and a transferred object during a transfer of the fine pattern, in which the spacer has a vent passage capable of flowing gas therethrough and has an elasticity against a pressing force during the transfer.

In the above invention (1), the following modifications and changes can be made.

(i) The main mold and the spacer are integrated together.

(ii) The main mold and the spacer are separate from each other.

(iii) The vent passage of the spacer is a hole and/or a groove.

(iv) The spacer has a spring constant less than that of the main mold at a temperature of the mold during the pattern transfer.

(v) The spacer has a Young's modulus not more than 500 MPa at a temperature of the mold during the pattern transfer.

(2) According to another aspect of the present invention, a method for forming a resin pattern by nanoimprint lithography includes the steps of:

applying a resin to a substrate of transferred object to prepare a transferred object;

placing a mold and the transferred object such that a space is formed between a protrusion of a fine pattern of a main mold and the transferred object by a spacer having an elasticity and a vent passage capable of flowing gas therethrough;

heating the transferred object up to a temperature above the glass transition temperature of the resin;

exhausting gas generated as the resin temperature is elevated through the vent passage of the spacer; and pressing the mold and elastically deforming the spacer to transfer the fine pattern of the main mold into the softened resin.

In the above invention (2), the following modifications and changes can be made.

(vi) The step of exhausting gas generated as the resin temperature is elevated through the vent passage of the spacer is a step of evacuating the inside of the mold to a vacuum.

(vii) The resin applied to the receiving substrate is a polyimide resin oligomer powder.

(viii) A plurality of the transferred objects and molds are stacked along a press axis and are pressed together.

ADVANTAGES OF THE INVENTION

According to the present invention, it is possible to facilitate alignment between a transferred object and a mold, and to suppress reduction in accuracy of pattern transfer caused by release of gas from a resin of the transferred object, thus obtaining a mold for transferring a fine pattern. Further, it is possible to provide a method for forming a resin pattern using the mold which can realize fine pattern transfer using nanoimprint lithography with high accuracy and at low cost compared to conventional methods.

BRIEF DESCRIPTION OF THE DRAWINGS

FIGS. 3(a) and 3(b) are schematic plan view and schematic cross sectional view, respectively.

FIGS. 6(a) and 6(b) are schematic views before and during a transfer, respectively.

FIGS. 7(a) and 7(b) are schematic views before and during a transfer, respectively.

FIGS. 8(a) and 8(b) are schematic views before and during a transfer, respectively.

DETAILED DESCRIPTION OF THE PREFERRED EMBODIMENTS

Preferred embodiments according to the present invention will be described below with reference to the accompanying drawings. However, the present invention is not limited to the embodiments described herein.

A First Embodiment

Figure 1:
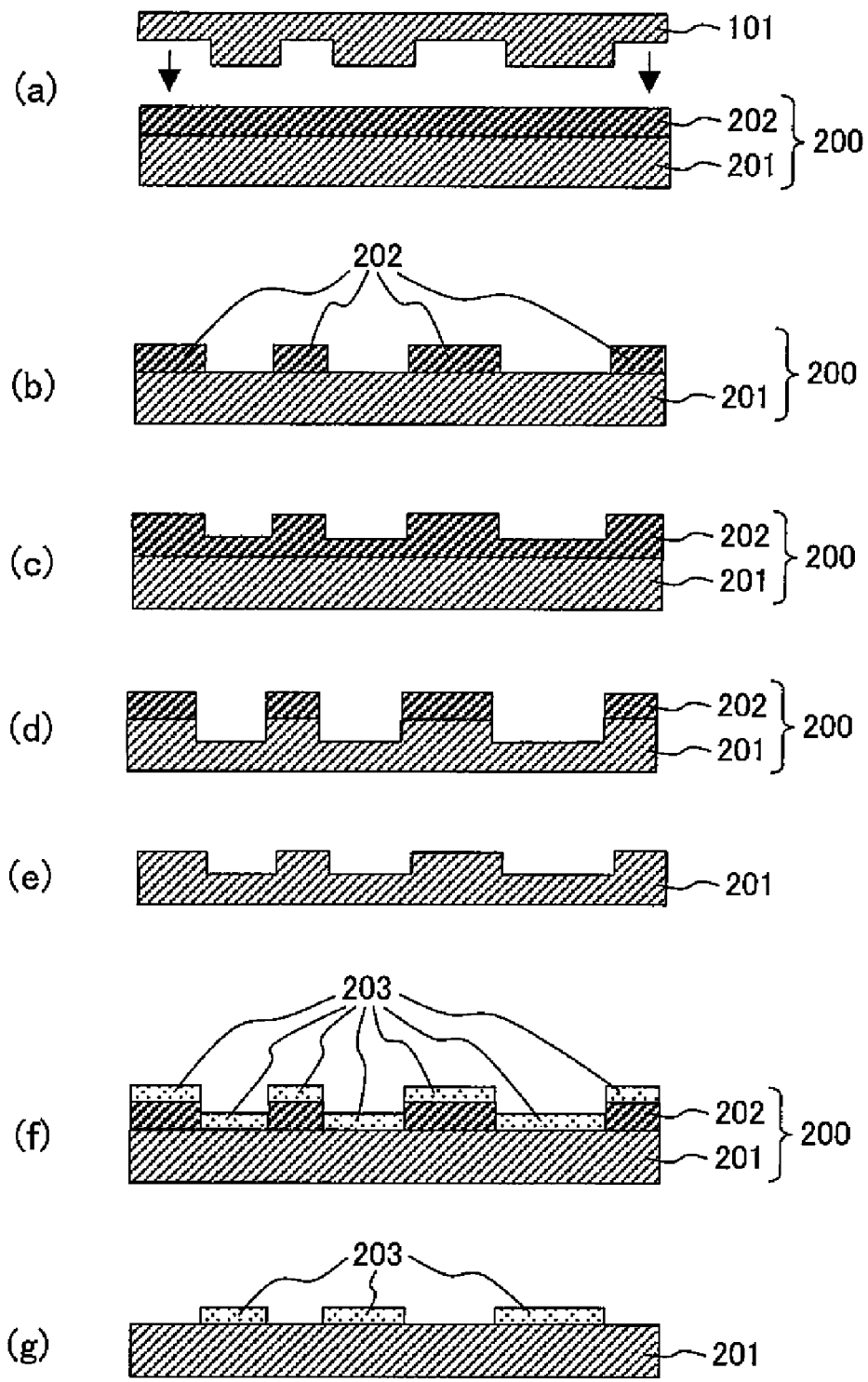
FIG. 1 is a schematic illustration showing an example of a process flow chart for forming a fine pattern using a conventional nanoimprint lithography.
Figure 2:
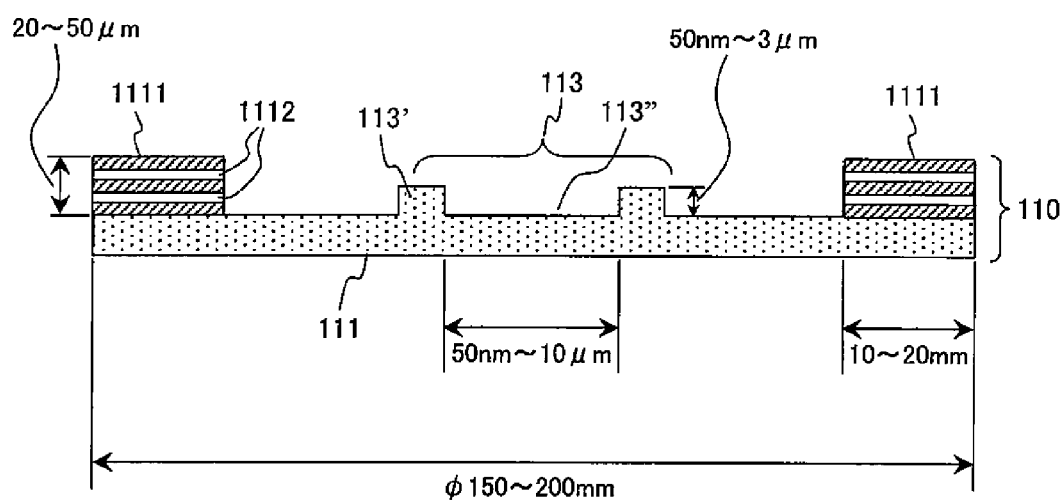
FIG. 2 is a schematic illustration showing a cross sectional view of a mold according to a first embodiment of the present invention.

FIG. 2 is a schematic illustration showing a cross sectional view of a mold according to a first embodiment of the present invention. The figure is partially enlarged for better understanding. And, the dimensions in the figure are merely an example. A mold 110 includes a main mold 111 and a spacer 1111. The main mold 111 has on its surface: a fine transfer pattern 113 (including a protrusion 113' and depression 113"); and the spacer 1111 which is integrated with the main mold 111 with a adhesive or the like.

The spacer 1111 is disposed along the outer periphery of the main mold 111, e.g., in a ring like manner, and protrudes higher than the protrusion 113' of the fine pattern. The spacer 1111 has a vent passage 1112 capable of passing gas therethrough. The vent passage 1112 has no particular limitation as to its shape and size but may be a hole or groove, preferably except that it is completely blocked by a pressing force during transfer. There is also no particular limitation on the position and number of the vent passages so long as they are appropriately set (e.g., eight directions) so as to achieve uniform gas flow.

In addition, the spacer 1111 preferably has an elasticity greater than that of the main mold, and is configured with a member (of a material and structure) such as resin, fibrous metal, fibrous ceramic and a composite thereof, which is elastically deformable in response to a pressing force during transfer. Here, "the spacer 1111 having an elasticity greater than that of the main mold" means that the spacer is more easily deformed than the main mold under a pressing force during transfer. In other words, the spacer has a spring constant less than that of the main mold at a mold temperature during pattern transfer.

In the particular case where the spacer 1111 is of a resinous material, it preferably has a Young's modulus within a range of 50 to 500 MPa at a mold temperature during pattern transfer. When the Young's modulus of the spacer 1111 exceeds 500 MPa at a mold temperature during pattern transfer, the depth to which the fine pattern 113 is pressed tends to become shallower in a pattern transfer process, thus leading to an insufficient transfer. On the other hand, when the Young's modulus is less than 50 MPa, the fine pattern 113 tends to contact a transferred object before pressing the pattern for transfer, resulting in a transfer failure due to residual gas.

A typical material for the spacer 1111 includes: polymers such as polyimides and polyamides; fluorine compounds such as PTFEs (polytetrafluoroethylenes); fibrous aluminum; fibrous stainless steel; glass wool; and rock wool. The elasticity may be provided by a structure such as: a structure having, in a side view, a meander-like or corrugated shape or the like; and a structure having a hollow transverse cross-section (such as a tube-like shape).

On the other hand, the main mold 111 is preferably made of a high stiffness material, such as a silicon substrate as well as glass, metal and other ceramics substrates. The fine pattern 113 can be formed by photolithography and etching technologies commonly used in a semiconductor device fabrication process as well as other processing technologies such as an electrical discharge process and ion beam process.

A Second Embodiment

Figure 3:
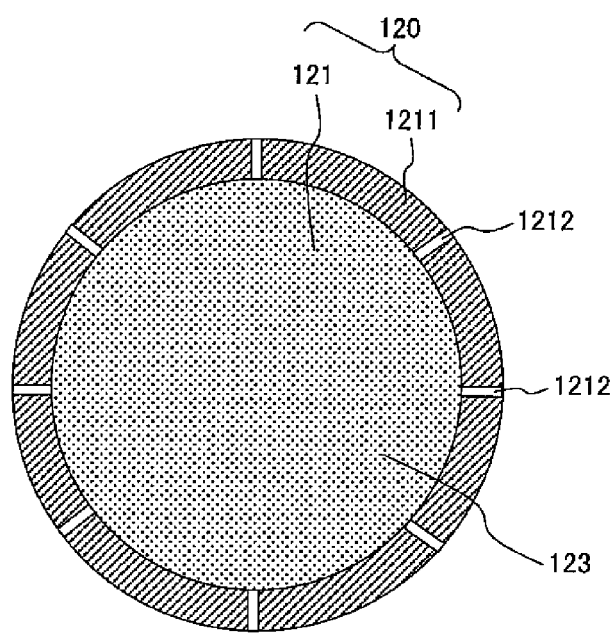
FIG. 3 is a schematic illustration showing a view of a mold according to a second embodiment of the present invention, where

FIG. 3 is a schematic illustration showing a view of a mold according to a second embodiment of the present invention, where FIGS. 3(a) and 3(b) are schematic plan view and schematic cross-sectional view, respectively. The figure is partially enlarged for better understanding. A mold 120 includes a main mold 121 and spacer 1211. The main mold 121 has on its surface a fine transfer pattern 123 (including a protrusion 123' and depression 123" not shown). The spacer 1211 is disposed along the outer periphery of the main mold 121 as shown in the figure, and is integrated with the main mold with an adhesive, fitting or the like.

The spacer 1211 protrudes higher than the protrusion 123' of the fine pattern of the main mold 121. In addition, the spacer 1211 has a vent passage 1212 capable of passing gas therethrough. The vent passage 1212 has no particular limitation as to its shape and size but may be a hole or groove, preferably except that it is completely blocked by a pressing force during transfer. There is also no particular limitation on the position and number of the vent passages so long as they are appropriately set (e.g., eight positions or more) so as to achieve uniform gas flow.

The other configurations (such as the material and structure of the spacer 1211, and the main mold 121) are similar to the aforementioned first embodiment. In this manner, a mold for transferring a fine pattern having effects similar to the aforementioned first embodiment can be obtained.

A Third Embodiment

Figure 4:
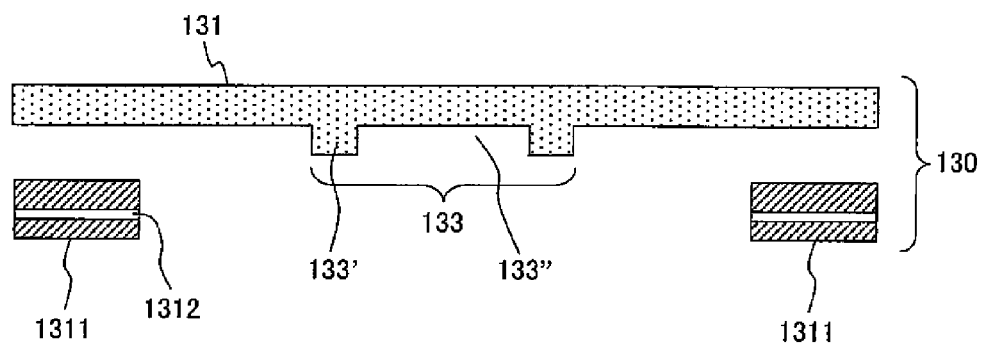
FIG. 4 is a schematic illustration showing a cross sectional view of a mold according to a third embodiment of the present invention.

FIG. 4 is a schematic illustration showing a cross sectional view of a mold according to a third embodiment of the present invention. The figure is partially enlarged for better understanding. A mold 130 includes a main mold 131 and spacer 1311. The main mold 131 has on its surface a fine transfer pattern 133 (including a protrusion 133' and depression 133".)

The spacer 1311 is, e.g., a ring like member which is separated from the main mold 131 and has a height higher than the protrusion 133' of the fine pattern of the main mold 131. In addition, the spacer 1311 has an inner diameter less than the outer diameter of the main mold 131 so as to contact the outer peripheral region of the main mold 131 when transferring the fine pattern. And, the spacer 1311 has an inner diameter larger than the outer diameter of the circumscribed circle of the fine pattern 133 so as not to overlap with the fine pattern 133. Further, the spacer 1311 has a vent passage 1312 capable of passing gas therethrough. The vent passage 1312 has no particular limitation as to its shape and size but may be a hole or groove, preferably except that it is completely blocked by a pressing force during transfer. There is also no particular limitation on the position and number of the vent passages so long as they are appropriately set (e.g., eight positions or more) so as to achieve uniform gas flow.

The other configurations (such as the material and structure of the spacer 1311, and the main mold 131) are similar to the aforementioned first embodiment. In this manner, a mold for transferring a fine pattern having effects similar to the aforementioned first embodiment can be obtained.

A Fourth Embodiment

Figure 5:
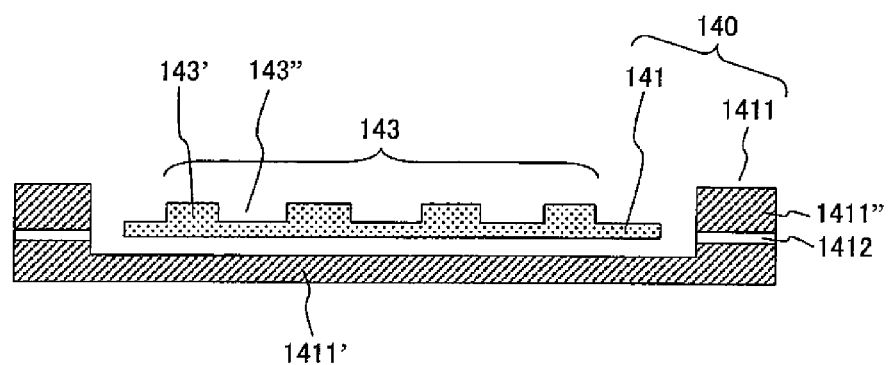
FIG. 5 is a schematic illustration showing a cross sectional view of a mold according to a fourth embodiment of the present invention.

FIG. 5 is a schematic illustration showing a cross sectional view of a mold according to a fourth embodiment of the present invention. The figure is partially enlarged for better understanding. A mold 140 includes a main mold 141 and separate spacer 1411. The main mold 141 has on its surface a fine transfer pattern 143 (including a protrusion 143' and depression 143").

The spacer 1411 is of a petri dish-like concave shape, and is configured such that: it lodges one of the main mold 141 and a transferred object on the upper face of the spacer's bottom plate 1411' (bottom of the concave); and the top of the spacer's side wall 1411" contacts the outer peripheral region of the other of the main mold 141 and transferred object. The inner height of the spacer's side wall 1411" (the depth of the concave) is higher (deeper) than the maximum thickness of the main mold 141 in the case of lodging the main mold 141, while it is higher (deeper) than the maximum thickness of the transferred object in the case of lodging the transferred object. Further, at least the spacer's side wall 1411" has a vent passage 1412 capable of passing gas therethrough. The vent passage 1412 has no particular limitation as to its shape and size but may be a hole or groove, preferably except that it is completely blocked by a pressing force during transfer. There is also no particular limitation on the position and number of the vent passages so long as they are appropriately set (e.g., eight positions or more) so as to achieve uniform gas flow.

In addition, at least the spacer side wall 1411" preferably has an elasticity greater than that of the main mold, and is configured with a member (of a material and structure) such as resin, fibrous metal, fibrous ceramic and a composite thereof, which is elastically deformable in response to a pressing force during transfer. Specifically, it may be configured similarly to the aforementioned first embodiment. Furthermore, the spacer's bottom plate 1411' may or may not be of the same material as the spacer's side wall 1411".

The other configuration (the main mold 141) is similar to the aforementioned first embodiment. In this manner, a mold for transferring a fine pattern having effects similar to the aforementioned first embodiment can be obtained.

[A Method for Forming a Resin Pattern]

Figure 6:
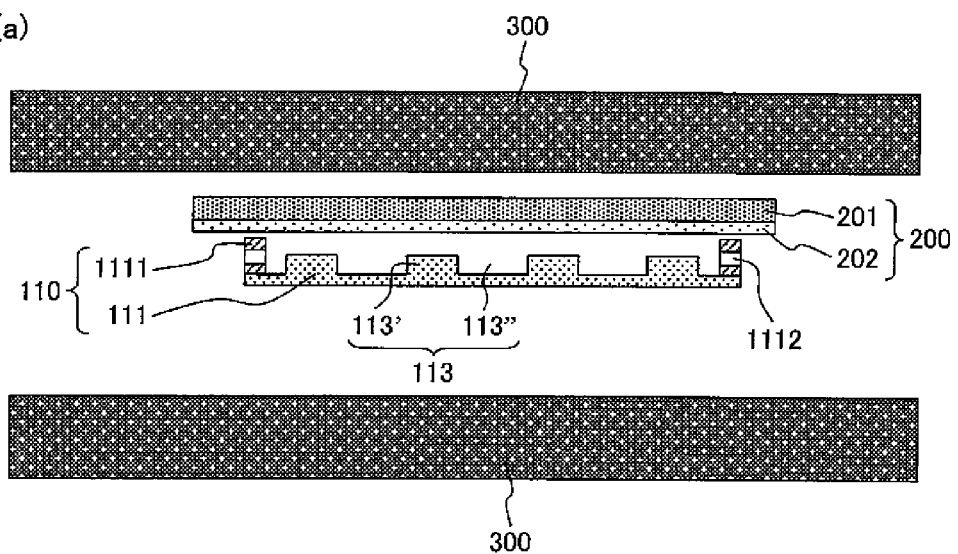
FIG. 6 is a schematic illustration of a cross sectional view showing a method for forming a resin pattern using a first embodiment mold, where
Figure 6:
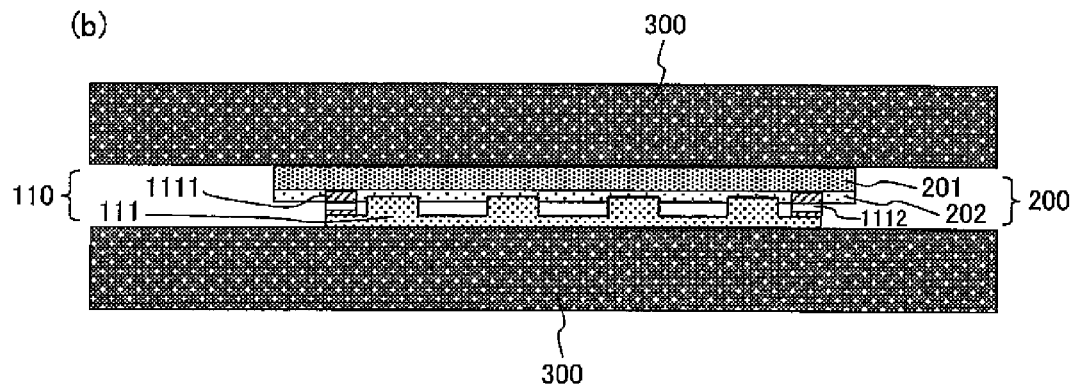

A method for forming a resin pattern using the preferred embodiments of the present invention will now be described below. FIG. 6 is a schematic illustration of a cross sectional view showing a method for forming a resin pattern using the first embodiment mold, where FIGS. 6(*a*) and 6(*b*) are schematic views before and during a transfer, respectively. In FIG. 6(*a*), a mold 110, transferred object 200, and stages 300 are illustrated spaced apart from each other for better understanding.

Firstly, a resin 202 serving as a receiver is applied to a substrate of transferred object 201 to prepare the transferred object 200. An applied material as the resin 202, which may be preferably used, includes polyimide resin oligomer powders.

Then a spacer 1111 of the mold 110 and the resin 202 of the transferred object 200 are placed between the stages 300 such that they face and contact each other (see FIG. 6(*a*)). Here, a space is formed between a protrusion 113' of a fine pattern 113 and the resin 202 because the height of the spacer 1111 is larger than that of the protrusion 113' of the fine pattern.

The mold 110 and transferred object 200 are then heated up to a temperature above the glass transition temperature of the resin 202. The purpose of this is to cause the resin 202 to flow such that the resin 202 easily conforms to every corner of the fine pattern 113. Here, the elevated temperature T is preferably above the glass transition temperature $T_g$ of the resin 202 and below the melting point $T_m$ thereof ($T_g \leq T \leq T_m$). An elevated temperature lower than the glass transition temperature will not cause the resin 202 to flow sufficiently, which tends to form voids at the corners of a depression 113" of the fine pattern 113. On the other hand, an elevated temperature higher than the melting point will render the resin 202 more likely to foam, thus leading to a defect in the transferred pattern. The elevated temperature is more preferably $T_g \leq T \leq (T_g+T_m)/2$, even more preferably $T_g \leq T \leq (2T_g+T_m)/3$.

Then, gas generated from the resin 202 as the temperature of the transferred object 200 is elevated is exhausted through a vent passage 1112 of the spacer 1111. When the temperature of the resin 202 is elevated, gaseous components remaining in the resin or decomposition products from the resin may be released as gas. This gas is exhausted through the vent passage 1112. In the present invention, the gas released can be smoothly exhausted since a space is formed, as described above, between the protrusion 113' of the fine pattern and the resin 202. Preferably, a vacuum (e.g., a low vacuum of about 1 hPa) is created inside the mold 110 by evacuating the surroundings thereof to a vacuum to exhaust the gas released more actively.

Then, as shown in FIG. 6(b), the stages 300 are activated to press the mold 110 and the transferred object 200 against each other. Here, the spacer 1111 is elastically deformed and the height becomes less than that of the protrusion 113' of the fine pattern, thereby allowing the fine pattern 113 formed on the mold 110 to be transferred in negative into the softened resin 202.

The temperature of the transferred object 200 is then decreased to below the glass transition temperature of the resin 202 while maintaining the pressing. This hardens the resin 202, and thus suppresses loss of shape in the fine pattern transferred. Moreover, the thermal shrinkage of the resin 202 offers good mold release from the mold 110.

In the mold 110 according to an embodiment of the present invention, the spacer 1111 is elastically deformed and returns to its original shape after the formation of a resin pattern, thus enabling repeated use thereof.

[Another Method for Forming a Resin Pattern]

Figure 7:
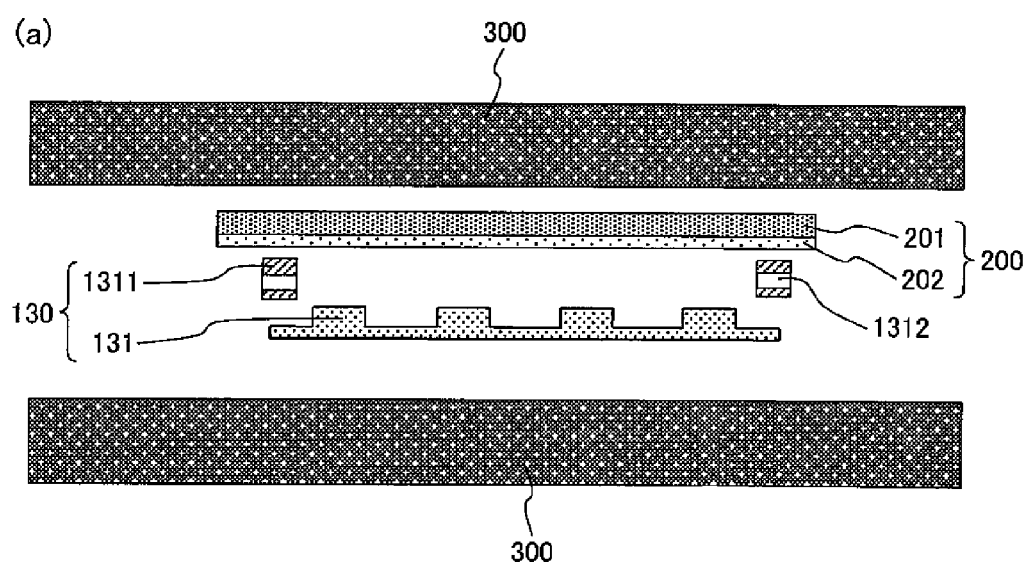
FIG. 7 is a schematic illustration of a cross sectional view showing a method for forming a resin pattern using a third embodiment mold, where
Figure 7:
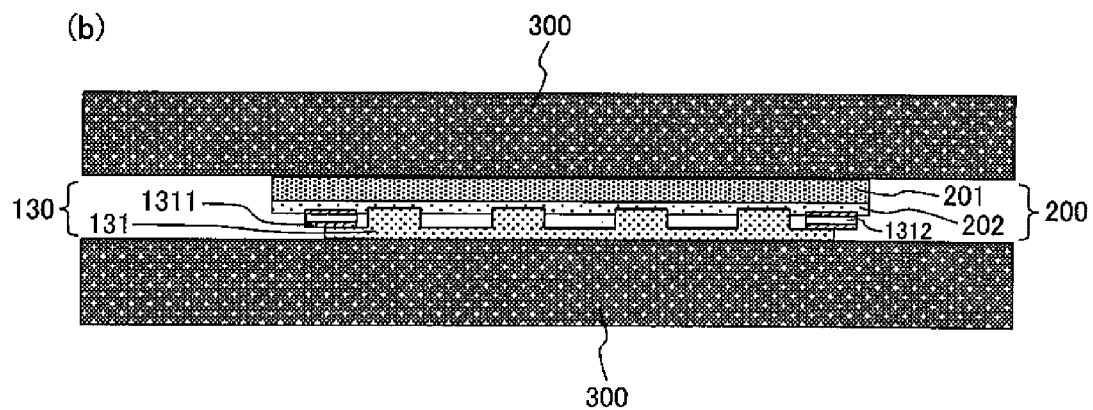

FIG. 7 is a schematic illustration of a cross sectional view showing a method for forming a resin pattern using the third embodiment mold, where FIGS. 7(a) and 7(b) are schematic views before and during a transfer, respectively. In FIG. 7(a), a mold 130, transferred object 200, and stages 300 are illustrated spaced apart from each other for better understanding.

As shown in FIG. 7, a high accuracy resin pattern can be formed with high yield using the third embodiment mold by performing process steps similar to those used in the first embodiment.

[Another Method for Forming a Resin Pattern]

Figure 8:
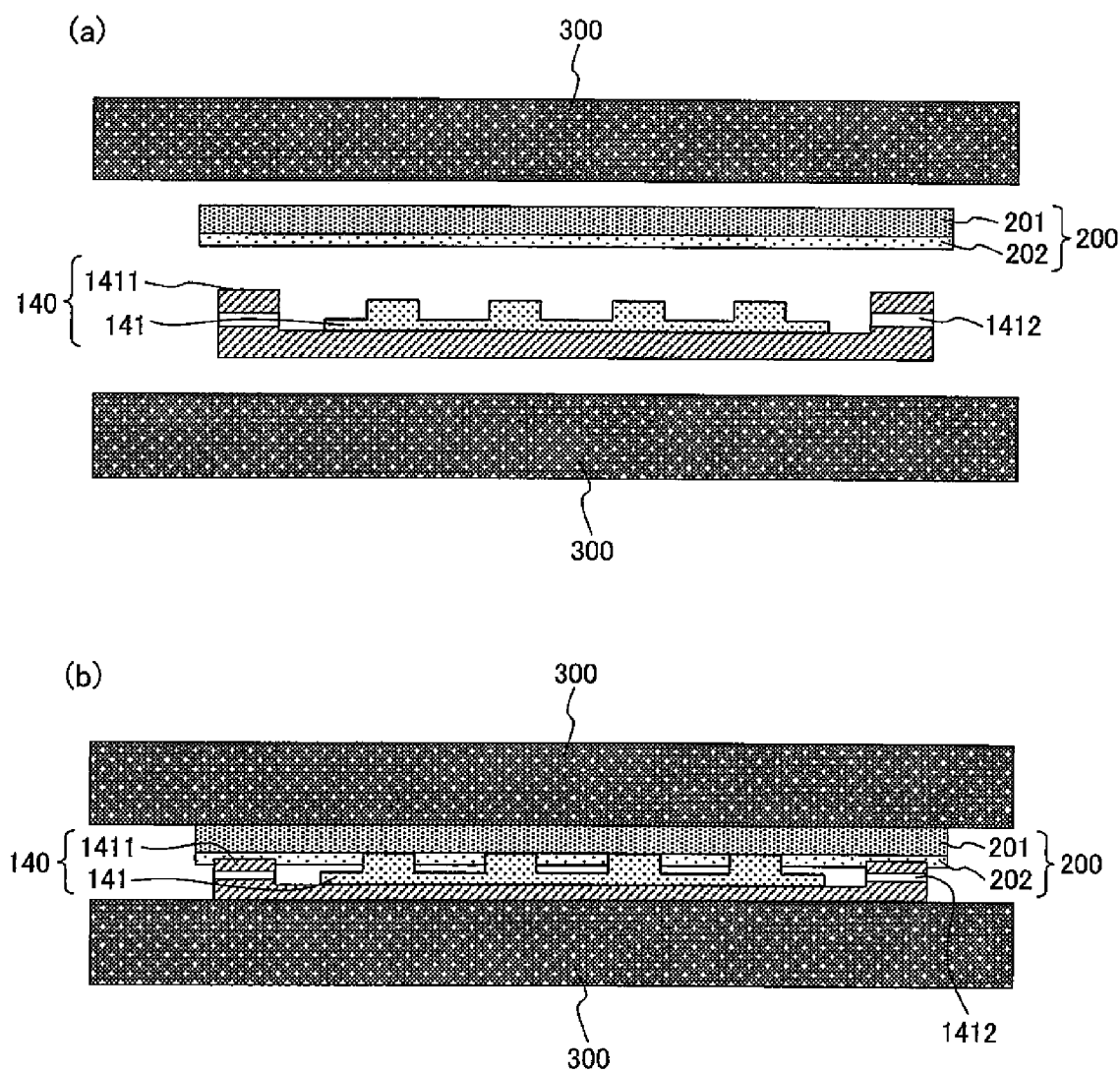
FIG. 8 is a schematic illustration of a cross sectional view showing a method for forming a resin pattern using a fourth embodiment mold, where

FIG. 8 is a schematic illustration of a cross sectional view showing a method for forming a resin pattern using the fourth embodiment mold, where FIGS. 8(a) and 8(b) are schematic views before and during a transfer, respectively. In FIG. 8(a), a mold 141, transferred object 200, and stages 300 are illustrated spaced apart from each other for better understanding.

As shown in FIG. 8, a high accuracy resin pattern can be formed with high yield using the fourth embodiment mold by performing process steps similar to those used in the first embodiment.

[Another Method for Forming a Resin Pattern]

Figure 9:
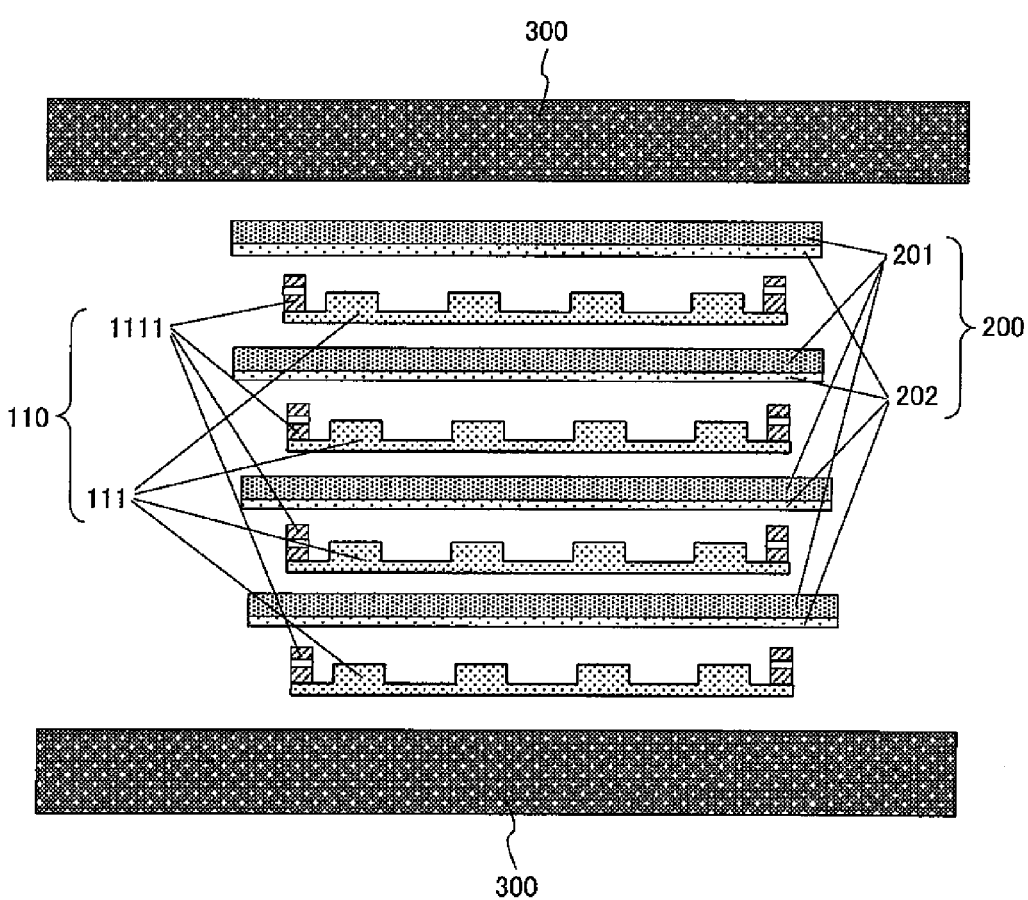
FIG. 9 is a schematic illustration of a cross sectional view showing a method for forming resin patterns using multiple molds and transferred objects according to a first embodiment of the present invention.

FIG. 9 is a schematic illustration of a cross sectional view showing a method for forming resin patterns using multiple molds and transferred objects according to the first embodiment of the present invention. FIG. 9 is a view before a transfer, in which molds 110, transferred objects 200, and stages 300 are illustrated spaced apart from each other for better understanding.

As shown in FIG. 9, multiple molds and transferred objects are stacked along a press axis and pressed together after performing process steps similar to aforementioned ones. Thus, high accuracy resin patterns can be formed in large quantities with high yield. With this forming method, multiple resin patterns can be formed in one pattern transfer, thus enabling substantial cost reduction over conventional photolithography and nanoimprint technologies.

Although FIG. 9 illustrates the case where the mold according to the first embodiment is used, no detailed explanation is necessary to show that the molds according to the second to fourth embodiments may be also used with similar advantages.

Advantages of the Embodiments

The following advantages can be obtained according to the above-mentioned embodiments.

(1) A transferred object and a mold can be placed to directly overlie each other, thereby facilitating alignment between the transferred object and the mold, and thus improving alignment accuracy.

(2) A space is formed between a fine pattern on a mold and a transferred object when placing them, and a spacer of the mold has a vent passage; therefore, gas generated from the transferred object as the temperature of the transferred object is elevated can be smoothly exhausted, thus suppressing reduction in transfer accuracy of the fine pattern due to residual gas.

(3) The improved alignment accuracy between a transferred object and a mold, and suppressed reduction in transfer accuracy of a fine pattern enhance the manufacturing yield of a resin pattern.

(4) Multiple resin patterns can be formed by stacking multiple pairs of a transferred object and a mold along a press axis and pressing them together, thus enabling substantial cost reduction over conventional photolithography and nanoimprint technologies.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A method for forming a resin pattern using a mold by nanoimprint lithography, comprising:

applying a resin to a substrate to prepare a transferred object;

placing a mold directly on the transferred object or placing the transferred object directly on a mold, the mold comprising a main mold including a fine pattern of a protrusion and a depression intended to be transferred onto the transferred object; and a spacer for forming a space between the protrusion of the fine pattern of the main mold and the transferred object, the spacer having a vent passage capable of flowing gas therethrough;

heating the transferred object to a temperature above a glass transition temperature of the resin;

exhausting gas generated as the resin temperature is elevated through the vent passage of the spacer by evacuating the inside of the mold to a low vacuum not less than 1 hPa; and pressing the mold and elastically deforming the spacer to transfer the fine pattern of the main mold into the softened resin, the spacer further having a Young's modulus in a compression direction within a range from 50 to 500 MPa at the temperature of the mold during the pattern transfer with the vent passage of the spacer being not completely blocked by a pressing force during the pattern transfer to achieve uniform as flow.

2. The method according to claim 1, wherein the resin applied to the substrate is a polyimide resin oligomer powder.

3. The method according to claim 1, wherein a plurality of transferred objects and molds are stacked along a press axis and are pressed together.

4. A method for forming a resin pattern using a mold by nanoimprint lithography, comprising:

applying a resin to a substrate to prepare a transferred object;

placing the transferred object directly on a mold having a fine transfer pattern of protrusions and depressions intended to be transferred onto the transferred object, and a spacer disposed along an outer periphery of the mold and protruded higher than the protrusions of the fine transfer pattern to form a space between the protrusions of the fine transfer pattern of the mold and the transferred object, the spacer having one or more vent passages capable of flowing gas therethrough;

heating the mold and the transferred object to a temperature above a glass transition temperature of the resin;

exhausting gas generated from the resin as the resin temperature is elevated through the one or more vent passages of the spacer by evacuating the mold to a low vacuum no less than 1 hPa;

pressing the mold against the transferred object and elastically deforming the spacer to transfer the fine transfer pattern of the mold into the softened resin, the spacer further having a Young's modulus in a compression direction within a range from 50 to 500 MPa at the temperature of the mold during the pattern with one or more vent passages of the spacer being not completely blocked by a pressing force during the pattern transfer to achieve uniform gas flow, and decreasing the temperature of the transferred object to a temperature below the glass transition temperature of the resin while maintaining the pressing; and releasing the mold relative to the transferred object after the fine transfer pattern is transferred onto the transferred object forming a resin pattern.

5. The method according to claim 4, wherein the resin applied to the substrate is a polyimide resin oligomer powder.

6. The method according to claim 4, wherein the spacer is disposed along the outer periphery of the mold, via adhesive.

7. The method according to claim 4, wherein the spacer is integrated and extended along the outer periphery of the mold.

8. The method according to claim 1, wherein the spacer is made of polyimides, polyamides, polytetrafluoroethylenes, fibrous aluminum, fibrous stainless steel, glass wool, or rock wool.

9. The method according to claim 1, wherein a height of the spacer is within a range from 20 to 50 μm.

10. The method according to claim 4, wherein the spacer is made of polyimides, polyamides, polytetrafluoroethylenes, fibrous aluminum, fibrous stainless steel, glass wool, or rock wool.

11. The method according to claim 4, wherein a height of the spacer is within a range from 20 to 50 μm.

* * * * *